(12) United States Patent
Han et al.

(10) Patent No.: US 9,606,182 B2
(45) Date of Patent: Mar. 28, 2017

(54) SYSTEM ON CHIP

(71) Applicant: Samsung Electronics Co., Ltd., Suwon-si (KR)

(72) Inventors: Dong-kwan Han, Suwon-si (KR); Ji-hye Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 120 days.

(21) Appl. No.: 14/607,607

(22) Filed: Jan. 28, 2015

(65) Prior Publication Data

US 2015/0362554 A1 Dec. 17, 2015

(30) Foreign Application Priority Data

Jun. 16, 2014 (KR) .................. 10-2014-0072971
Jul. 9, 2014 (KR) .................. 10-2014-0086153

(51) Int. Cl.
*G01R 31/3185* (2006.01)

(52) U.S. Cl.
CPC ......... *G01R 31/318575* (2013.01); *G01R 31/318563* (2013.01)

(58) Field of Classification Search
CPC .......... G01R 31/318575; G01R 31/318563
See application file for complete search history.

(56) References Cited

U.S. PATENT DOCUMENTS

| | | | |
|---|---|---|---|
| 5,881,067 A * | 3/1999 | Narayanan | G01R 31/318544 324/73.1 |
| 6,023,778 A | 2/2000 | Li | |
| 7,398,442 B2 | 7/2008 | Peeters | |
| 7,649,395 B2 | 1/2010 | Ahmadi | |
| 7,712,002 B2 | 5/2010 | Baba | |
| 7,816,960 B2 | 10/2010 | Saint-Laurent et al. | |
| 7,831,877 B2 | 11/2010 | Sul et al. | |
| 7,954,022 B2 | 5/2011 | Chakraborty et al. | |
| 8,140,923 B2 | 3/2012 | Goel et al. | |
| 8,269,534 B2 | 9/2012 | Kim | |
| 8,461,871 B2 | 6/2013 | Ishizuka | |
| 2002/0093864 A1 * | 7/2002 | Ooishi | G11C 7/18 365/222 |
| 2004/0250165 A1 | 12/2004 | Tanizaki | |
| 2008/0222471 A1 | 9/2008 | Sul et al. | |
| 2010/0107024 A1 * | 4/2010 | Tokunaga | G01R 31/318552 714/729 |

(Continued)

FOREIGN PATENT DOCUMENTS

| | | |
|---|---|---|
| JP | 2002082145 | 3/2002 |
| JP | 2011047771 | 3/2011 |

(Continued)

*Primary Examiner* — April Y Blair
*Assistant Examiner* — Thien D Nguyen
(74) *Attorney, Agent, or Firm* — Onello & Mello, LLP

(57) ABSTRACT

A system on chip (SOC) is provided. The system on chip (SOC) includes: at least one core including a plurality of scan chains operated by a trigger signal; a delay controller generating a delay target selection signal selecting at least one of the plurality of scan chains and a delay depth control signal indicating a delay depth of the trigger signal; and a delay signal generating unit delaying the trigger signal based on the delay target selection signal and the delay depth control signal and providing the delayed trigger signal to the plurality of scan chains.

18 Claims, 9 Drawing Sheets

(56) References Cited

U.S. PATENT DOCUMENTS

| | | | |
|---|---|---|---|
| 2010/0211839 A1* | 8/2010 | Almukhaizim | G06F 11/267 714/729 |
| 2011/0099442 A1* | 4/2011 | Hales | G01R 31/318533 714/729 |
| 2011/0260767 A1 | 10/2011 | Devta-Prasanna et al. | |
| 2013/0173971 A1 | 7/2013 | Zimmerman | |
| 2013/0227257 A1* | 8/2013 | Singh | G06F 1/24 713/1 |
| 2015/0295560 A1* | 10/2015 | Pal | H03K 3/012 377/66 |

FOREIGN PATENT DOCUMENTS

| | | |
|---|---|---|
| KR | 2001053900 | 3/2007 |
| KR | 2007067615 | 6/2007 |
| KR | 2009047027 | 5/2009 |

\* cited by examiner

SYSTEM ON CHIP

CROSS-REFERENCE TO RELATED APPLICATION

This application claims the benefit of Korean Patent Application No. 10-2014-0072971, filed on Jun. 16, 2014, and Korean Patent Application No. 10-2014-0086153, filed on Jul. 9, 2014, in the Korean Intellectual Property Office, the disclosure of which is incorporated herein in its entirety by reference.

BACKGROUND

The present inventive concepts relate to a system on chip (SOC) which may reduce dynamic voltage drop.

An application specific integrated circuit (ASIC) technology has developed to an SOC which is a system that includes cores including a chip-set formed of a plurality of chips including a plurality of function blocks. Integrated circuits of the SOC include various function blocks, such as a microprocessor, an interface, a memory array, and a digital signal processor (DSP). The function blocks, which are designed as above and completed to be verified, are referred to as cores.

However, even if it seems that the cores operate normally when they are tested each independently, an additional verification is needed as to whether the plurality of cores are normally connected, after the plurality of cores are manufactured as the SOC. The most effective one among the test technologies that determine an error of logic circuits in the SOC is a scan test method which places flip-flops which are connected by chains in which an identical trigger signal is input at two ends of logic circuits in cores and tests whether each of the logic circuits accurately operates. However, in the scan test method in which changes occur simultaneously in a large number of logic circuits, the dynamic voltage drop may cause a drop of the test reliability of the SOC test. Also, when an error of a path related to asynchronous set/reset signals is tested, the dynamic voltage drop of the SOC, due to output changes of a plurality of flips-flops connected to the asynchronous set/reset signals, may also cause the drop of the test reliability of the SOC test.

SUMMARY

The present inventive concepts provide a system on chip (SOC) which controls a delay of a trigger signal including a clock signal and an asynchronous set/reset signal, which is input in each scan chain in cores, for testing whether logical circuits in the cores accurately operate.

According to an aspect of the present inventive concepts, there is provided a system on chip including: at least one core including a plurality of scan chains operating by a trigger signal; a delay controller generating a delay target selection signal selecting at least one of the plurality of scan chains and a delay depth control signal indicating a delay depth of the trigger signal; and a delay signal generating unit delaying the trigger signal based on the delay target selection signal and the delay depth control signal and providing the delayed trigger signal to the plurality of scan chains.

The trigger signal may be a set/reset signal.

The delay controller may include a delay target selecting unit receiving a delay information signal and generating the delay target selection signal.

The delay target selecting unit may include a plurality of flip-flops which are sequentially connected, receiving the delay information signal and outputting the delay target selection signal.

The delay controller may include a delay depth control unit receiving the delay information signal and generating the delay depth control signal.

The delay depth control unit may include a plurality of flip-flops which are sequentially connected, receiving the delay information signal and outputting the delay depth control signal.

The delay signal generating unit may include a plurality of delay timing units receiving the delay target selection signal and the delay depth control signal.

The plurality of delay timing units may include at least one scan delay unit generating a delayed trigger signal of the trigger signal based on the delay target selection signal and the delay depth control signal.

The at least one scan delay unit may include at least one delay unit determining toggling of the delayed trigger signal based on the delay target selection signal and selecting a delay time of the delayed trigger signal based on the delay depth control signal.

The SOC may further include a joint test action group (JTAG) interface which sets the delay target selection signal and the delay depth control signal before providing the delayed trigger signal to the plurality of scan chains.

According to another aspect of the present inventive concepts, there is provided a system on chip (SOC) including: at least one core including a plurality of scan chains operating by a trigger signal; a delay controller generating a delay target selection signal selecting at least one of the plurality of scan chains and a delay depth control signal indicating a delay depth of the trigger signal; a delay signal generating unit delaying the trigger signal based on the delay target selection signal and the delay depth control signal and providing the delayed trigger signal to the plurality of scan chains; and a joint test action group (JTAG) interface receiving the delay target selection signal and the delay depth control signal.

The trigger signal may be a set/reset signal.

The delay controller may include a delay target selecting unit receiving a delay information signal and generating the delay target selection signal.

The delay target selecting unit may include a plurality of flip-flops which are sequentially connected, receiving the delay information signal and outputting the delay target selection signal.

The delay controller may include a delay depth control unit receiving a delay information signal and generating the delay depth control signal.

The delay depth control unit may include a plurality of flip-flops which are sequentially connected, receiving the delay information signal and outputting the delay depth control signal.

The delay signal generating unit may include a plurality of delay timing units receiving the delay target selection signal and the delay depth control signal.

The plurality of delay timing units may include at least one scan delay unit generating a delayed trigger signal of the trigger signal based on the delay target selection signal and the delay depth control signal.

The scan delay unit may include at least one delay unit determining toggling of the delayed trigger signal based on the delay target selection signal and selecting a delay time of the delayed trigger signal based on the delay depth control signal.

The delay target selection signal and the delay depth control signal may be pre-set via the JTAG interface before the delayed trigger signal is provided to the plurality of scan chains.

BRIEF DESCRIPTION OF THE DRAWINGS

Exemplary embodiments of the present inventive concepts will be more clearly understood from the following detailed description taken in conjunction with the accompanying drawings in which.

DETAILED DESCRIPTION OF EMBODIMENTS

Figure 1:
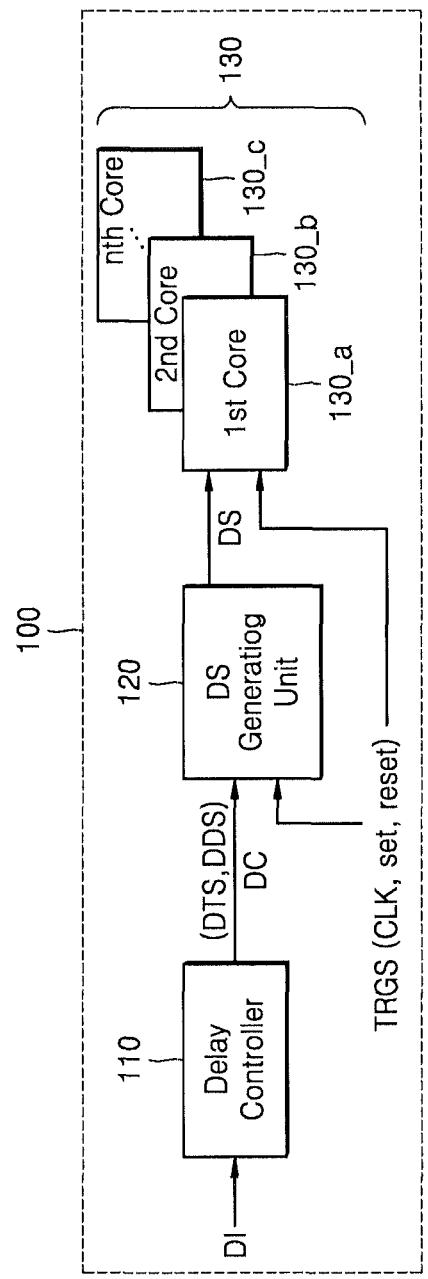
FIG. 1 is a block diagram of a system on chip (SOC) according to an exemplary embodiment of the present inventive concepts.

The present inventive concepts now will be described more fully hereinafter with reference to the accompanying drawings, in which elements of the invention are shown. The present inventive concepts may, however, be embodied in many different forms and should not be construed as limited to the exemplary embodiments set forth herein. Rather, these embodiments are provided so that this disclosure will be thorough and complete, and will fully convey the scope of the present inventive concepts to one of ordinary skill in the art. In the drawings, the same reference numerals denote the same elements and the thicknesses of layers and regions and the sizes of components may be exaggerated for clarity.

Meanwhile, the terminology used herein is for the purpose of describing particular embodiments only and is not intended to be limiting of exemplary embodiments. As used herein, the singular forms "a," "an," and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "trigger signal" may denote a clock signal or a set/reset signal. The set/reset signal may include at least one of a set signal or a reset signal. Hereinafter, the clock signal or the set/reset signal may be referred to as the trigger signal for convenience of explanation.

FIG. 1 is a block diagram of a system on chip (SOC) 100 according to an exemplary embodiment of the present inventive concepts.

Referring to FIG. 1, the SOC 100 may include a delay controller 110, a delay signal generating unit 120, and a plurality of cores 130. Here, according to the present exemplary embodiment, the SOC 100 may be referred to as a device under test (DUT), during a test mode, and the SOC 100 hereinafter is a concepts including the DUT. The delay controller 110 may provide various signals to the delay signal generating unit 120 to control a delay of a clock signal and a set/reset signal when the test is performed. For example, the delay controller 110 may provide a delay control signal DC to the delay signal generating unit 120, which may be performed based on a delay information signal DI that is received by the delay controller 110. The delay information signal DI may be provided to the delay controller 110 from external automatic test equipment (ATE). Also, the delay information signal DI may include scan chain information about which scan chains in a core share a trigger signal, the core being one in which the trigger signal requires a delay control, information about a delay depth of the trigger signal, and a test mode input signal commanding a performance of a test. The delay control signal DC may include a delay selection signal DTS for selecting a core in the cores 130, in which the trigger signal requires a delay control, and a delay depth signal DDS for controlling the delay depth of the trigger signal. According to an exemplary embodiment, a first core 130_a may be selected from the cores 130 by the delay selection signal DTS and the delay signal DS may be provided to the first core 130_a. Furthermore, a plurality of cores may be selected and the delay signal DS may be provided to the selected plurality of cores. The delay selection signal DTS may be a signal that selects a scan chain formed of a flip-flop, which is included in the first core 130_a which is selected, and the delay depth signal DDS may be a signal that may vary the delay depth, according to selected scan chains.

The delay signal generating unit 120 may receive the delay control signal DC from the delay controller 110, may receive a clock signal or a set/reset signal from the outside, and based on the received delay control signal DC, may generate the delay signal DS to provide the delay signal DS to the plurality of cores 130. The delay signal generating unit 120 may be formed of a plurality of blocks generating the delay signal DS. The plurality of blocks may have a one-to-one correspondence to the plurality of cores 130, and further, may have a one-to-one correspondence to scan chains which share the clock signal or the set/reset signal. The delay signal DS may be provided to the cores selected from the plurality of cores 130, based on the delay control signal DC. The delay signal DS may include a plurality of delay signals which vary in terms of the delay depth of the trigger signal, and thus, each delay signal DS having a different delay depth may be provided to each core. Further, the delay signals DS may be provided to selected scan chains which are formed of flip-flops included in each core and share the trigger signal, by having different delay depths according to the selected scan chains.

According to an exemplary embodiment, the delay controller 110 may provide a first delay signal or a second delay signal which is a delayed clock signal CLK or a delayed set/reset signal, to the first core 130_a which is selected from the plurality of cores 130, by controlling the delay signal generating unit 120. For example, the delay depth may be controlled in the delay controller 110 in a unit delay time such that the first delay signal which is the delayed clock signal CLK and the second delay signal which is the delayed set/reset signal may be generated and provided to the first core 130_a. The first delay signal and the second delay signal may refer to the clock signal CLK and the set/reset signal which is delayed based on a predetermined unit delay time. The first delay signal and the second delay signal may include a plurality of delay signals having different delay depths. Furthermore, the selected first core 130_a may include a plurality of logic circuits and a plurality of scan chain units. The scan chain unit may include at least one scan chain and the scan chain may be formed of a plurality of flip-flops. Some scan chain units may receive an identical clock signal CLK or set/reset signal. Also, the clock signal CLK or the set/reset signal which is input may be different according to each scan chain unit. Accordingly, the delay controller 110 may select at least one scan chain unit in the first core 130_a to provide the delay signal DS, by controlling the delay signal generating unit 120. The first delay signal which is the clock signal CLK which is delayed for an hour or the second delay signal which is the set/reset signal which is delayed for two hours may be generated and provided to the at least one scan chain unit which is selected.

That is, each delay signal DS provided in each selected core or selected scan chain may be one that is controlled to have a different delay depth. According to the present exemplary embodiment, data of memory devices, such as flip-flops of the plurality of cores 130, may be prevented from being simultaneously converted, and timing of the data conversion may be dispersed so that the dynamic voltage drop may be prevented and a test operation may be accurately performed.

A detailed structure of each block diagram and a detailed control operation of the clock signal or the set/reset signal will be described later. Hereinafter, the clock signal or the set/reset signal will be referred to as a trigger signal TRGS.

Figure 2:
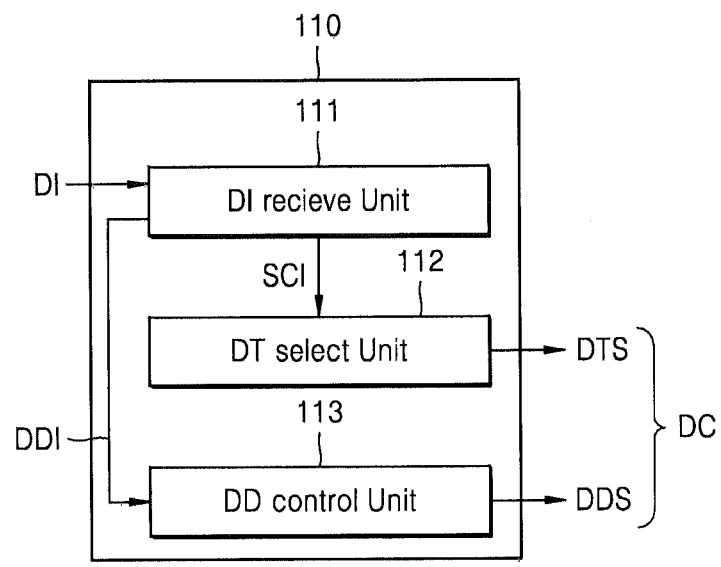
FIG. 2 is a block diagram of an example of a delay controller of FIG. 1.

FIG. 2 is a block diagram of an example of the delay controller 110 of FIG. 1.

Referring to FIGS. 1 and 2, the delay controller 110 may include a delay information signal receiving unit 111, a delay target selecting unit 112, and a delay depth control unit 113. The delay information signal receiving unit 111 may receive a delay information signal DI to provide scan chain information SCI included in the delay information signal DI to the delay target selecting unit 112 and may provide a delay depth information DDI of the trigger signal TRGS to the delay depth control unit 113. The delay target selecting unit 112 may provide a delay target selection signal DTS which selects a core from the plurality of cores 130, which needs a delay control of the trigger signal TRGS, or a scan chain in the plurality of cores, to the to the delay signal generating unit 120 of FIG. 1, by referring to the scan chain information. The delay target selection signal DTS may include a plurality of selection signals and the delay signal generating unit 120 may receive the delay target selection signal DTS to provide the delay signal DS to the selected core or the selected scan chain.

The delay depth control unit 113 may provide a delay depth control signal DDS which controls the delay depth of the trigger signal TRGS to the delay signal generating unit 120. The delay depth control signal DDS may include a plurality of control signals. The delay signal generating unit 120 may receive the delay depth control signal DDS, generate the delay signals DS having different delay depths, and provide the delay signals DS to the selected cores or scan chains. For example, when a first core is selected from the plurality of cores 130 by the delay controller 110, the delay target selection signal DTS indicating that the first core is selected may be provided to the delay signal generating unit 120. Also, the delay depth control unit 113 may provide the delay depth control signal DDS to the delay signal generating unit 120 so that the delay signal DS which is the trigger signal TRGS which is delayed for a one-unit delay time may be generated. This is only according to an exemplary embodiment, and the delay target selection signal DTS which controls to select at least one scan chain unit from a plurality of scan chain units in the first core, may be provided to the delay signal generating unit 120. Also, the delay depth control unit 113 may covert the trigger signal TRGS which is input with reference to the delay depth control signal DDS to the delay signals DS having different time delay units.

Figure 3:
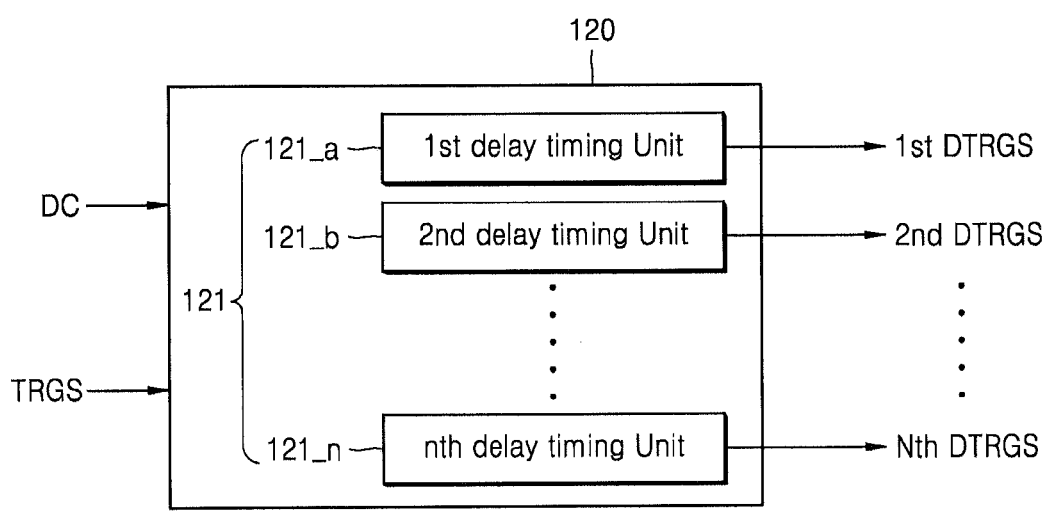
FIG. 3 is a block diagram of an example of a delay signal generating unit of FIG. 1.
Figure 4:
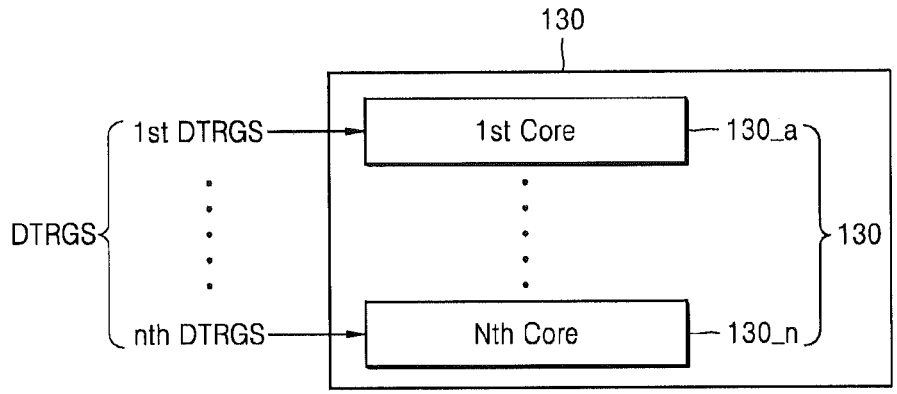
FIG. 4 is a block diagram of an example of a plurality of cores of FIG. 1.

FIG. 3 is a block diagram of an example of the delay signal generating unit 120 of FIG. 1 and FIG. 4 is a block diagram of an example of the plurality of cores 130 of FIG. 1.

Referring to FIGS. 3 and 4, the delay signal generating unit 120 may include a plurality of delay timing units 121_a through 121_n which may delay the trigger signal TRGS. Also, the plurality of cores 130 may include first through $n^{th}$ cores 130_a through 130_n. According to an exemplary embodiment, the delay timing units 121 of the delay signal generating unit 120 may be provided by the same number as the cores 130 130_a through 130_n or as the plurality of scan chains. Furthermore, the delay timing unit 121, the plurality of cores 130, and the plurality of scan chains may have a one-to-one correspondence so that the delay timing unit 121 corresponding to each core may provide the delay trigger signal. For example, the first delay timing unit 121_a may provide a first delay trigger signal $1^{st}$ DTRGS to the first core 130_a, and the $n^{th}$ delay timing unit 121_n may provide an $n^{th}$ delay trigger signal $n^{th}$ DTRGS to the $n^{th}$ core 130_n. Also, only the delay timing unit corresponding to the selected core or the selected scan chain may perform the delay of the trigger signal TRGS, based on the delay target selection signal DTS included in the delay control signal DC, thereby providing the delay signal DS only to the selected core or the selected scan chain. By this process, the data conversion timing of the selected core or the selected scan chain may be made different from the data conversion timing of the core or the scan chain which is not selected, or the data conversion timing of the selected cores and the selected scan chains may be made different from each other, so that simultaneous changes in outputting of the flip-flops in the plurality of cores or the scan chains may be prevented.

Figure 5:
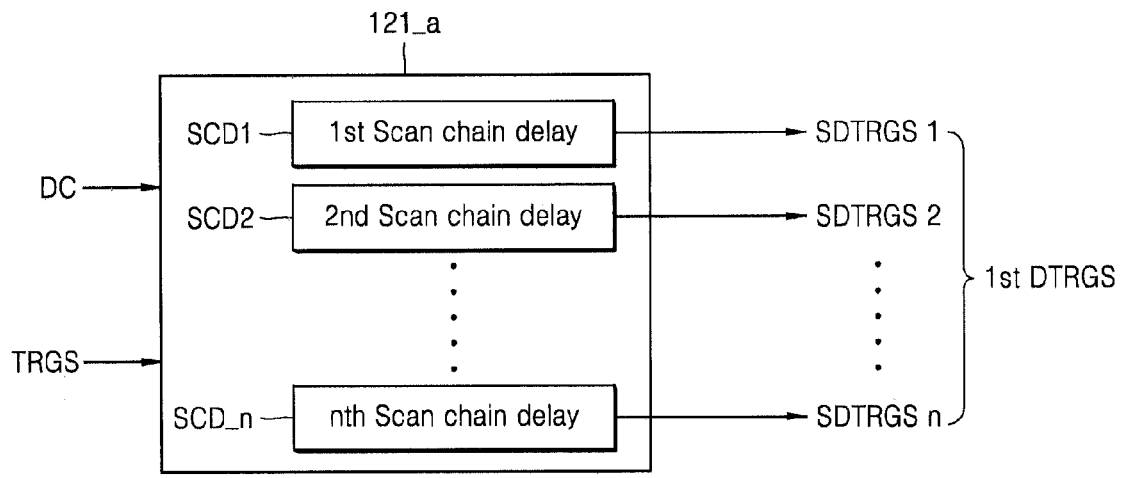
FIG. 5 is a block diagram of an example of a delay timing unit of FIG. 3.
Figure 6:
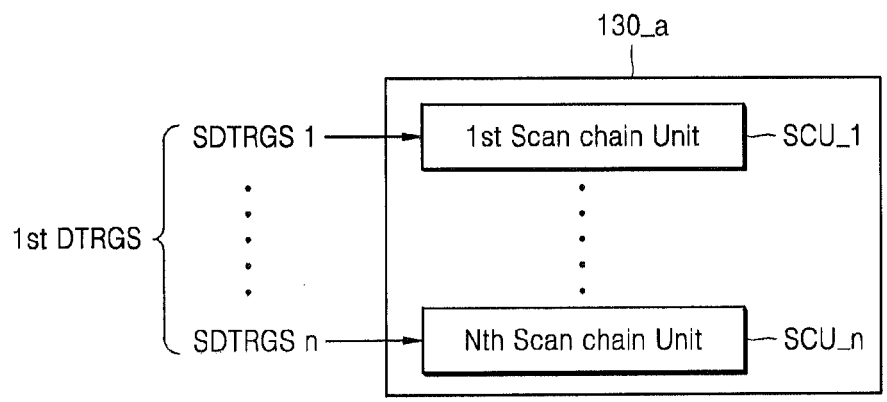
FIGS. 6 and 7 are block diagrams of an example of the plurality of cores of FIG. 4.
Figure 7:
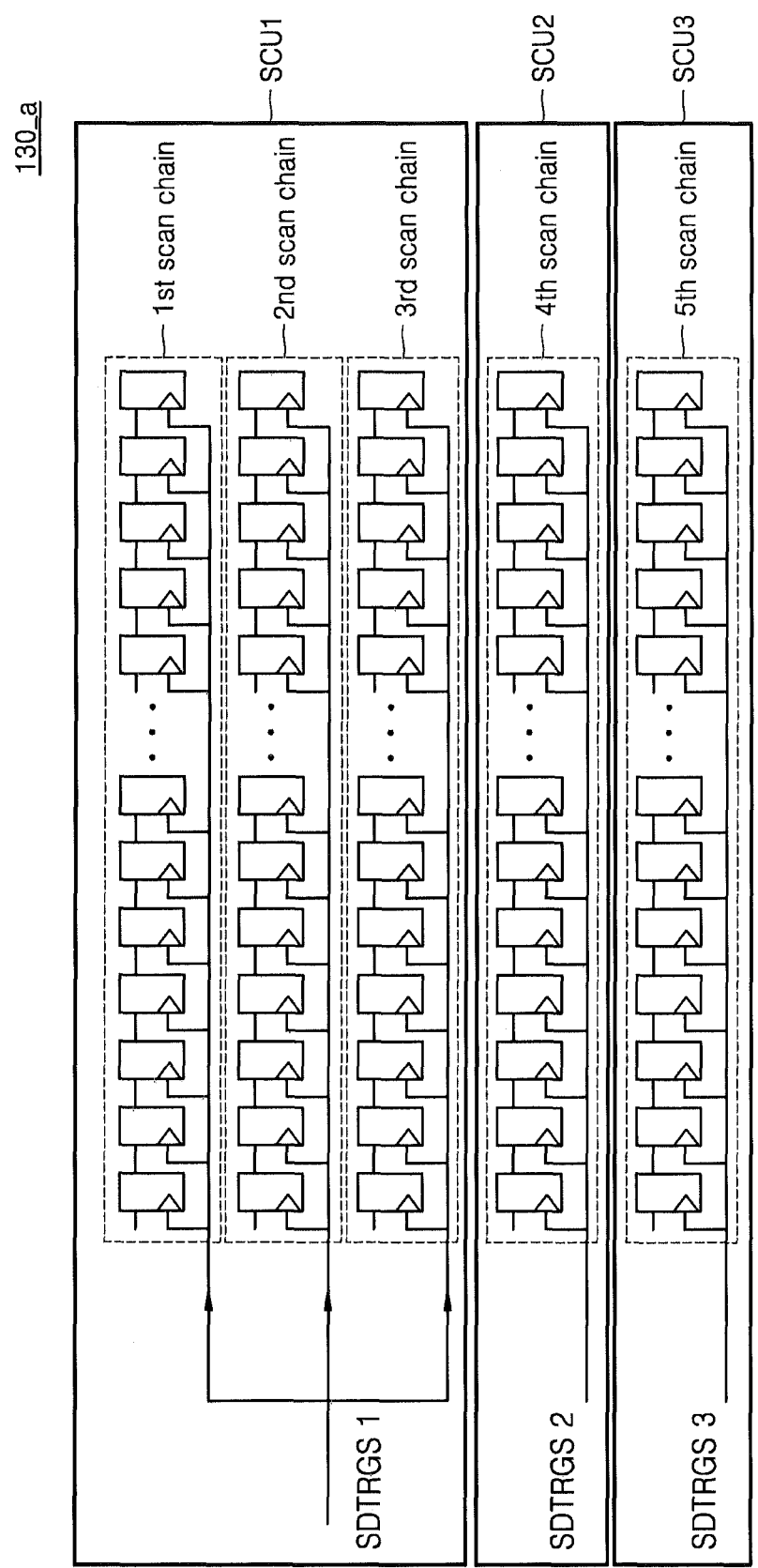

FIG. 5 is a block diagram of an example of the first delay timing unit 121_a of FIG. 3. FIGS. 6 and 7 are block diagrams of an example of the first core 130_a of FIG. 4.

Referring to FIGS. 5 and 6, the delay timing unit 121_a may include a plurality of scan chain delays SCD_1 through SCD_n. Also, in order to test an operation of the first core 130_a of FIG. 4 among the plurality of cores 130, the first core 130_a of FIG. 4 may include a plurality of scan chain units SCU_1 through SCU_n. According to an exemplary embodiment, the scan chain delays SCD may be provided by the same number as the scan chain units SCU. Furthermore, the scan chain delay SCD and the scan chain unit SCU may have a one-to-one correspondence, and thus, the delay trigger signal may be provided to each scan chain delay SCD corresponding to each scan chain unit SCU. For example, the first scan chain delay SCD_1 may provide a first scan delay trigger signal SDTRGS 1 to the first scan chain unit SCU_1 and the $n^{th}$ scan chain delay SCD_n may provide an $n^{th}$ scan delay trigger signal SDTRGS n to the $n^{th}$ scan chain unit SCD_n (n is a natural number which is equal to or larger than 1). The first through $n^{th}$ scan delay trigger signals SDTRGS 1 through SDDTRGS n provided to the first core 130_a may be referred to as a first delay trigger signal $1^{st}$ DTRGS. Also, the delay of the trigger signal TRGS may be performed with respect to only a scan chain delay SCD corresponding to a selected scan chain unit SCU, based on the delay target selection signal DTS included in the delay control signal DC, so as to provide the delay signal DS only to the selected scan chain unit SCU.

Referring to FIG. 7, according to an exemplary embodiment, the scan chain units SCU1, SCU2, and SCU3 in the first core 130_a may include at least one scan chain connected to the scan trigger signal SDTRGS which is the clock signal. The at least one scan chain may be formed of a plurality of flip-flops. For example, first, second, and third scan chains $1^{st}$ through $3^{rd}$ scan chains which share the first scan trigger signal SDTRGS 1 which is the clock signal of the plurality of flip-flops, in the first scan chain unit SCU1 of the first core 131_a, may be included in the first scan chain unit SCU1. A fourth scan chain $4^{th}$ scan chain sharing the second scan trigger signal SDTRGS 2 may be included in the second scan chain unit SCU2. The fifth scan chain $5^{th}$ scan chain sharing the third scan trigger signal SDTRGS 3 may be included in the third scan chain unit SCU3. Each of the scan delay trigger signals SDTRG 1 through SDTRG n may be a delay trigger signal having a different delay depth when a delay operation is performed. For example, the first scan chain delay SCD1 may delay the trigger signal TRGS which is input for one-unit delay time to provide the first scan delay trigger signal SDTRGS 1 to the first scan chain unit SCU1 and the second scan chain delay SCD_2 may delay the trigger signal TRGS which is input for two-units delay time to provide the second scan delay trigger signal SDTRGS 2 to the second scan chain unit SCU2. Also, the third scan chain delay SCD3 may delay the trigger signal TRGS which is input for three-units delay time to provide the third scan delay trigger signal SDTRGS 3 to the third scan chain unit SCU3. The unit delay time may be, for example, a unit which is one clock cycle. However, the unit delay time is not limited thereto, and may indicate various units. As a result, data conversion timing of the flip-flops of each of the scan chain units SCU_1 through SCU_3 may be made different so that simultaneous data conversions of the plurality of flip-flops may be prevented. This is only according to an exemplary embodiment, and exemplary embodiments of the present inventive concepts are not limited thereto. Three or more scan chain units SCU may be included, and each of the scan delay trigger signals SDTRGS 1, . . . , or SDTRGS n may be provided to each scan chain unit SCU by varying the delay depth of the trigger signal TRGS which is input, by using various methods. Also, each of the scan chain units SCU1, . . . , or SCU3 may include a scan chain having a different length.

In FIG. 7, the case where the trigger signal TRGS is the clock signal is described. However, the trigger signal TRGS is not limited thereto and may be an asynchronous initialization signal, such as a set/reset signal. An operation and effect of the trigger signal TRGS which is the set/reset signal may be substantially the same as an operation and effect of the trigger signal TRGS which is the clock signal.

Figure 8:
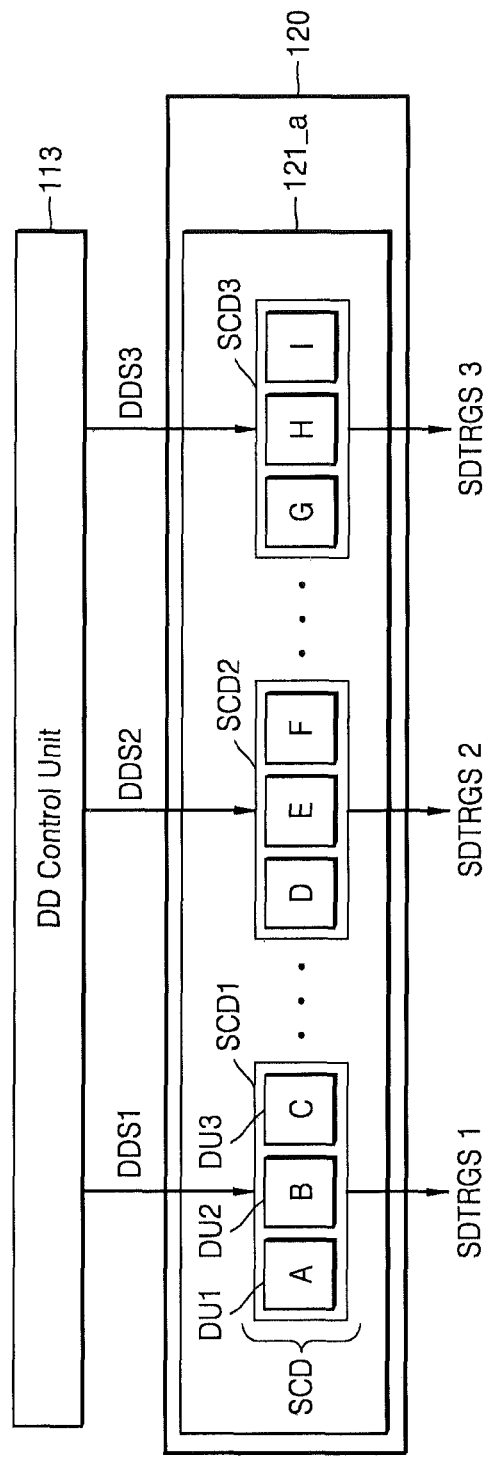
FIG. 8 is a block diagram which is illustrated with respect to a delay control performance of a trigger signal of a delay depth control unit.

FIG. 8 is a block diagram of the delay depth control unit 113.

FIG. 8 is a block diagram illustrating an exemplary embodiment of the present inventive concepts in which the delay depth control unit 113 provides a delay control signal DC to the first delay timing unit 121_a of FIG. 3 to control the delay depth of the trigger signal TRGS which is input. The first delay timing unit 121_a may include the first scan chain delay SCD1, the second scan chain delay SCD2, and the third scan chain delay SCD3. The first scan chain delay SCD1 may include first through third delay units A, B, and C. The second scan chain delay SCD2 may include fourth through sixth delay units D, E, and F. The third scan chain delay SCD3 may include seventh through ninth delay units G, H, and I.

A delay time of the trigger signal which is input (TRGS: CLK or set/reset signal) may be at least one clock cycle based on a delay control clock (delay_control_clk) which is input. The unit delay time may be a clock cycle. To describe an operation, first, the delay depth is determined by the delay depth control unit 113 based on the delay information signal D1 and each of first through third delay depth signals DDS1 through DDS 3 may be provided to the scan chain delay SCD. According to an exemplary embodiment, the first scan chain delay SCD1 may receive the first delay depth signal DDS1 and select all of the first through third delay units A, B, and C. Each of the delay units A through I may delay the trigger signal TRGS which is input by a unit of one clock cycle. Thus, the first scan chain delay SCD1 may provide the first scan delay trigger signal SDTRGS 1 which is delayed for three clock cycles to the first scan chain unit SCU1 in the first core 131a. Also, the second scan chain delay SCD2 may receive the second delay depth signal DDS2 and select two delay units among the fourth through sixth delay units D, E, and F. Thus, the second scan chain delay SCD2 may provide the second scan delay trigger signal SDTRGS 2 which is delayed for two clock cycles to the second scan chain unit SCU2 in the first core 131a. Also, the third scan chain delay SCD3 may receive the third delay depth signal DDS3 and select only one among the seventh through ninth delay units G, H, and I. Thus, the third scan chain delay SCD3 may provide the third scan delay trigger signal SDTRGS 3 which is delayed for one clock cycle to the third scan chain unit SCD3 in the first core 131_a. This is only according to an exemplary embodiment, and exemplary embodiments of the present inventive concepts are not limited thereto. The delay controller 110 may select the scan chain unit SCU to apply the scan delay trigger signal SDTRGS, and only the scan chain delay SCD corresponding to the selected scan chain unit SCU may perform the delay of the trigger signal TRGS, in order to provide the scan delay trigger signal SDTRGS to only the selected scan chain unit SCU. Also, methods of controlling the delay depth may be realized in various ways. According to another exemplary embodiment, referring to FIG. 3, the delay depth control unit 113 may provide the delay depth signal DDS to the delay timing unit 121 included in the delay signal generating unit 120, to provide the scan delay trigger signal SDTRGS to each core 131 of the cores 130, so that the data conversion timing may be controlled in a core unit.

Figure 9:
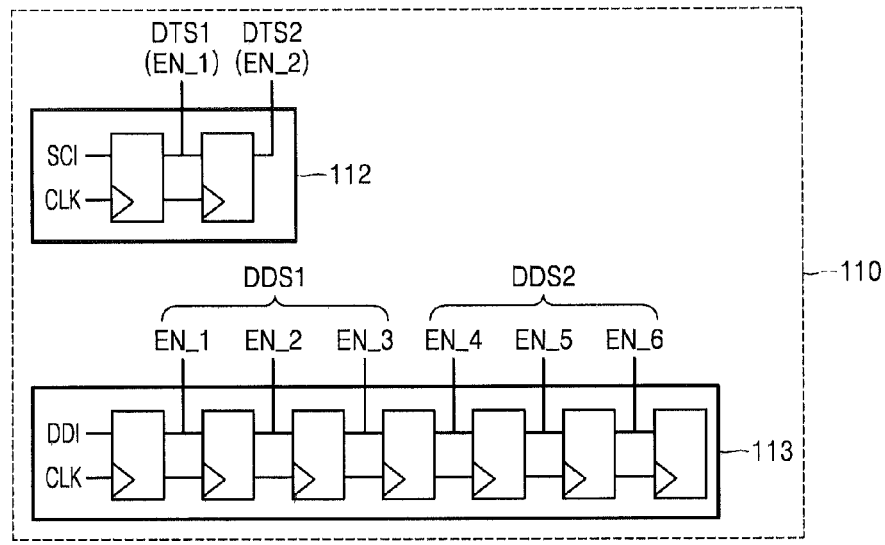
FIG. 9 is a block diagram of an example of the delay depth control unit of FIG. 8.
Figure 10:
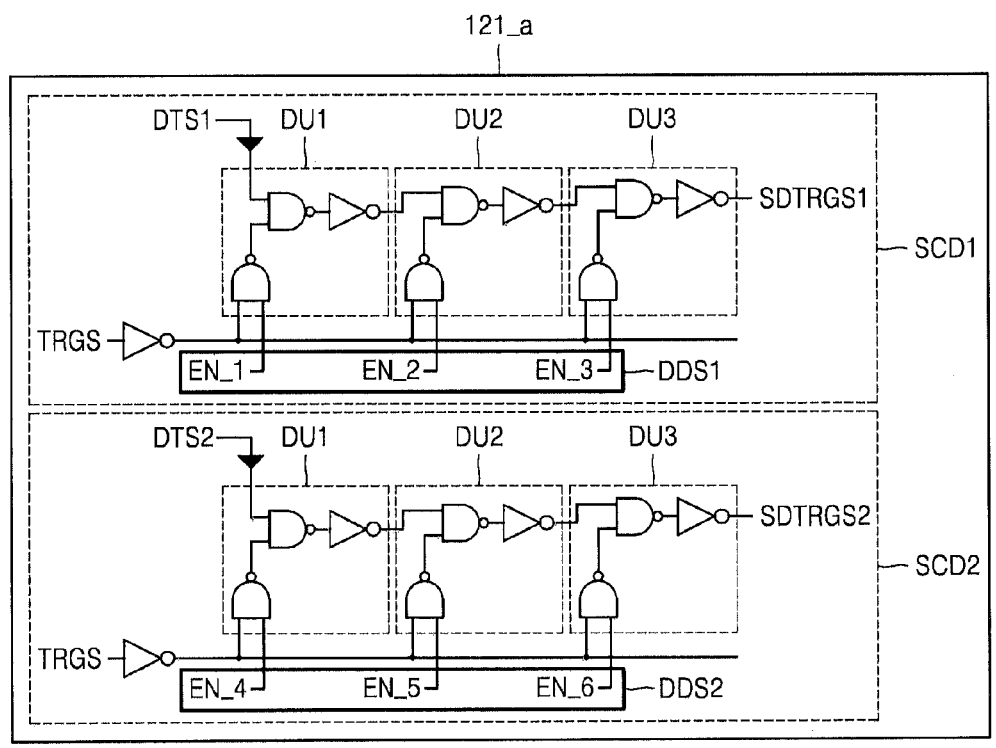
FIG. 10 is a block diagram of an example of a first delay timing unit of FIG. 8.

FIGS. 9 and 10 are respectively block diagrams of an example of the delay depth control unit 113 and an example of the first delay timing unit 121_a of FIG. 8.

Referring to FIGS. 9 and 10, the delay target selecting unit 112 and the delay depth control unit 113 each may be formed of a plurality of flip-flops. The delay target selecting unit 112 may receive the scan chain information SCI to generate the delay target selection signal DTS. The delay depth control unit 113 may receive the delay depth information DDI to generate the delay depth control signal DDS. Also, the plurality of flip-flops may output an enable signal EN. The delay target selecting unit 112 provides a first delay target selection signal DTS1 and a second delay target selection signal DTS2 to the first delay timing unit 121_a. The delay depth control unit 113 provides the first delay depth control signal DDS1 and the second delay depth control signal DDS2 to the first delay timing unit 121_a.

An output value of the plurality of flip-flops of the delay target selecting unit 112 and the delay depth control unit 113 may be set by shifting a value received from the scan chain information SCI and the delay depth information DDI according to the clock signal CLK which is input. The delay target selecting unit 112 and the delay depth control unit 113 may be pre-set before the scan test. The clock signal CLK may be a scan chain shift clock which is the trigger signal TRGS or may be another clock used for setting of the delay target selecting unit 112 and the delay depth control unit 113, which is separate from the trigger signal TRGS.

The first delay timing unit 121_a according to the present exemplary embodiment may include a scan chain delay SCD formed of at least one delay unit DU. The delay unit DU may delay the trigger signal which is applied in a unit delay time. For example, when the enable signal EN is applied to the delay unit DU, the trigger signal TRGS may be delayed for a unit delay time which is set. The unit delay time is a unit smaller than one clock cycle and may be a propagation delay of at least one logic gate.

The first delay timing unit 121_a of FIG. 10 may include the first scan chain delay SCD1 and the second scan chain delay SCD2. Each scan chain delay SCD1 or SCD2 may include a plurality of delay units DU1 through DU3. The first delay timing unit 121_a may generate the first scan delay trigger signal SDTRGS 1 and the second scan delay trigger signal SDTRGS 2 by referring to the delay target selection signal DTS and the delay depth control signal DDI.

To describe a detailed operation, the delay depth control unit 113 may provide the first delay depth control signal DDS1 formed of first through third enable signals EN_1 through EN3 to the first scan chain delay SCD1. When the first through third enable signals EN_1 through EN3 output a logic value of 111, the trigger signal TRGS may pass all the three delay units DU1 through DU3 and provide the first scan delay trigger signal SDTRGS 1 which is delayed for three-units delay time. On the contrary, when the first through third enable signals EN1 through EN3 output a logic value of 001, the trigger signal TRGS may pass one delay unit DU3 and provide the first scan delay trigger signal SDTRGS 1 which is delayed for one-unit delay time.

The delay target selecting unit 112 may provide the first delay target selection signal DTS1 and the second delay target selection signal DTS2 to the first delay timing unit 121_a to determine an operation of each of the scan chain delays SCD1 or SCD2. That is, when the first delay target selection signal DTS1 has logic 0, the first scan chain delay SCD1 may control the first scan delay trigger signal SDTRGS 1 not to perform toggling so that a scan chain connected to the first scan delay trigger signal SDTRGS 1 does not operate. Also, when the first delay target selection signal DTS1 has logic 1, the first scan chain delay SCD1 may control the first scan delay trigger signal SDTRGS 1 to perform toggling so that the scan chain connected to the first scan delay trigger signal SDTRGS 1 operates. However, this is only according to an exemplary embodiment. The first delay target selection signal DTS1 is not limited to having the described logic states and this fact may also be applied to other delay target selection signals DTS.

Figure 11A:
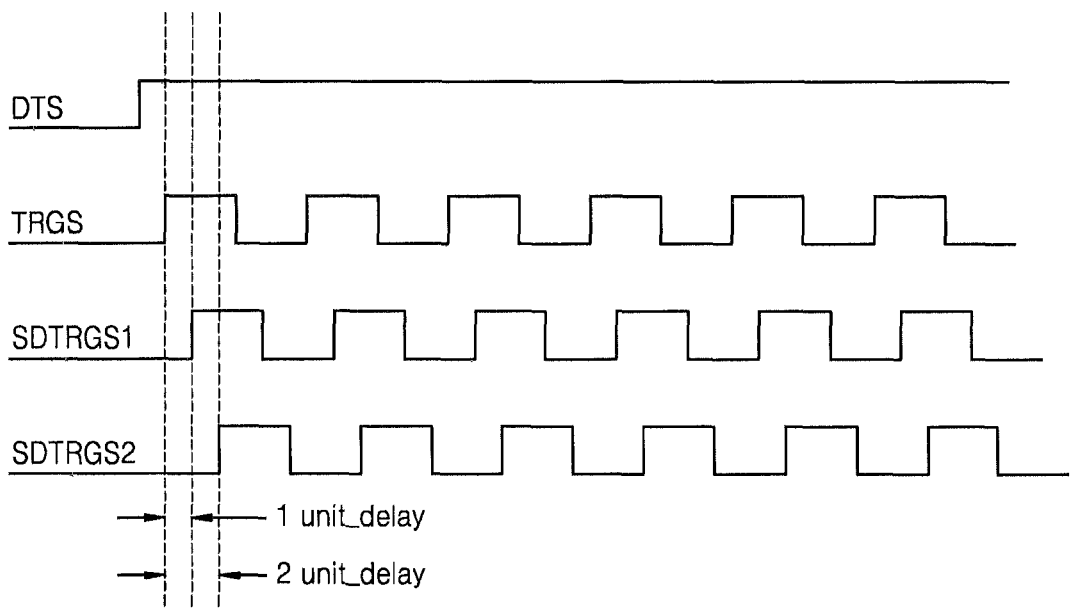
FIG. 11A is a timing view with respect to a delay signal generated in a delay signal generating unit.
Figure 11B:
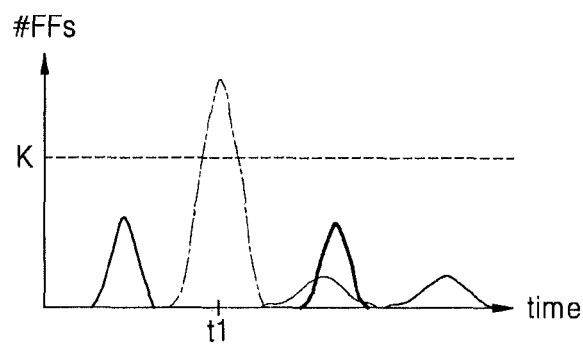
FIGS. 11B and 11C are graphs illustrating effects of exemplary embodiments of the present inventive concepts.

FIG. 11A is a timing view of a delay signal generated by the delay signal generating unit 120. FIG. 11B is a view illustrating effects of exemplary embodiments of the present inventive concepts.

FIG. 11A is a view of the delay operation with respect to the trigger signal TRGS according to an exemplary embodiment of the present inventive concepts. FIG. 11A illustrates the exemplary embodiment in which the core includes the first and second scan chain units SCD. The delay target selection signal DTS may be converted from logic level 0 to logic level 1 to control the delay of the trigger signal TRGS which is applied, as illustrated in FIGS. 9 and 10, and thus, the first scan delay trigger signal SDTRGS 1 having the first unit delay and the second scan delay trigger signal SDTRGS 2 having the second unit delay may be generated. The first scan delay trigger signal SDTRGS 1 may be provided to the first scan chain unit of the core and the second scan delay trigger signal SDTRGS 2 may be provided to the second scan chain unit. As described in FIG. 6, the first and second scan delay trigger signals SDTRGS 1 and SDTRGS 2 may be included in one delay trigger signal DTRGS. According to another exemplary embodiment, the delay signal generating unit 120 may generate a plurality of scan delay trigger signals SDTRGS corresponding to the number of the scan chain units in the core which includes the plurality of scan chain units and provide each of the plurality of scan delay trigger signals SDTRGS to each of the scan chain units. As shown above, by making the delay depths of the trigger signals TRGS different, outputs of the plurality of flip-flops in the core or in the scan chain may be prevented from being simultaneously converted.

Figure 11C:
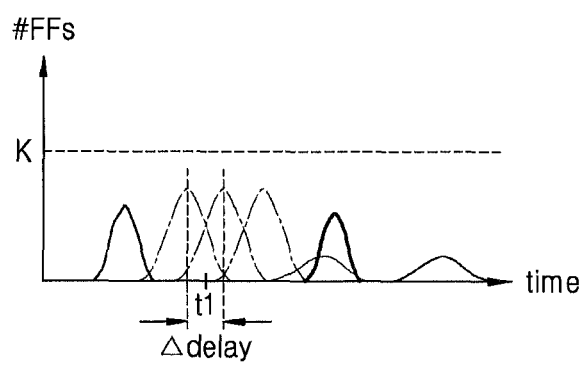

Referring to FIG. 11B, a dynamic voltage drop may occur as the number of flip-flops in which data is simultaneously converted during time t1 exceeds a reference value K. On the contrary, according to an exemplary embodiment of the present inventive concepts, referring to FIG. 11C, the delay signal generated by varying the delay depth of the trigger signal is provided to each core or scan chain unit so that the flip-flops in which outputs are simultaneously converted during the time t1 are dispersed so that the outputs are converted in different terms. Thus, it may be controlled that the number of flip-flops in which the outputs are simultaneously converted does exceed the reference value K. Accordingly, the dynamic voltage drop may be prevented.

Figure 12:
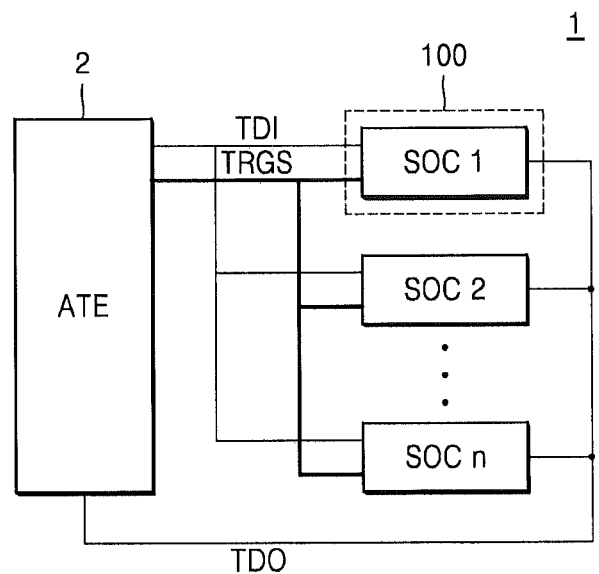
FIG. 12 is a block diagram of an SOC test system according to an exemplary embodiment of the present inventive concepts.

FIG. 12 is a block diagram of an SOC test system according to an exemplary embodiment of the present inventive concepts.

Referring to FIG. 12, a semiconductor device test system 1 includes at least one piece of automatic test equipment (hereinafter, ATE 2) and the SOCs 100 according to the exemplary embodiments of the present inventive concepts.

The ATE 2 is a test device according to the IEEE standards, which tests whether each core included in the SOC 100 accurately operates according to its own characteristic. The IEEE standards may include an interface corresponding to a Joint Test Action Group (JTAC) protocol. The ATE 2 is connected with the SOC 100 via five channels and may include input pins to which a test input data signal TDI, a clock signal CLK which is a trigger signal TRGS, and a set/reset signal are applied, and an output pin which outputs test output data TDO.

The delay information signal DI may be input via the test input data signal TDI or an additional pin. The delay information signal DI may include a test mode input signal for performing the test.

The SOC 100 is a device under test, which includes a plurality of cores having different functions. For example, the SOC 100 may include a system on chip, a microprocessor, and very large system integration (VLSI). The SOC 100 may be connected with the ATE 2 via the five channels.

Figure 13:
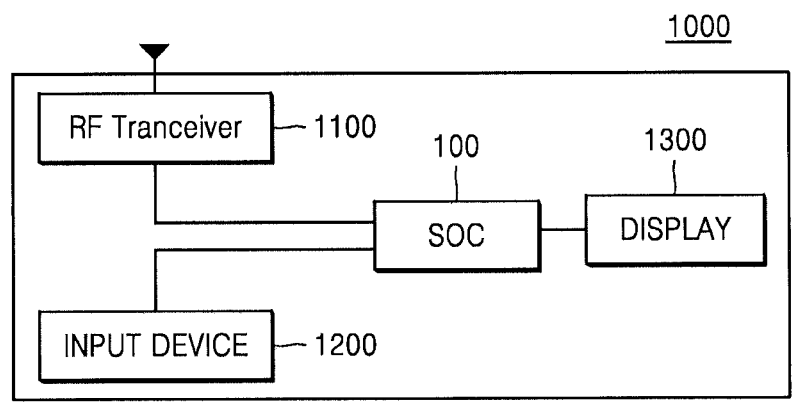
FIG. 13 is a block diagram of a semiconductor system including the SOC illustrated in FIG. 1, according to an exemplary embodiment of the present inventive concepts.

FIG. 13 is a block diagram of a semiconductor system 1000 including the SOC 100 illustrated in FIG. 1, according to an exemplary embodiment of the present inventive concepts.

Referring to FIG. 13, the semiconductor system 1000 includes the SOC 100 illustrated in FIG. 1, an antenna, a wireless transceiver 1100, an input device 1200, and a display 1300. The wireless transceiver 1100 may transmit or receive a wireless signal via the antenna. For example, the wireless transceiver 1100 may covert the wireless signal received via the antenna to a signal which may be processed in the SOC 100. Thus, the SOC 100 may process the signal output from the wireless transceiver 1100 and transmit the processed signal to the display 1300. Also, the wireless transceiver 1100 may convert the signal output from the SOC 100 to a wireless signal and output the converted wireless signal to an external device via the antenna. The input device 1200 is a device which may input a control signal for controlling an operation of the SOC 100 or data which is to be processed via the SOC 100. The input device 1200 may include pointing devices, such as a touch pad and a computer mouse, a keypad, or a keyboard.

Figure 14:
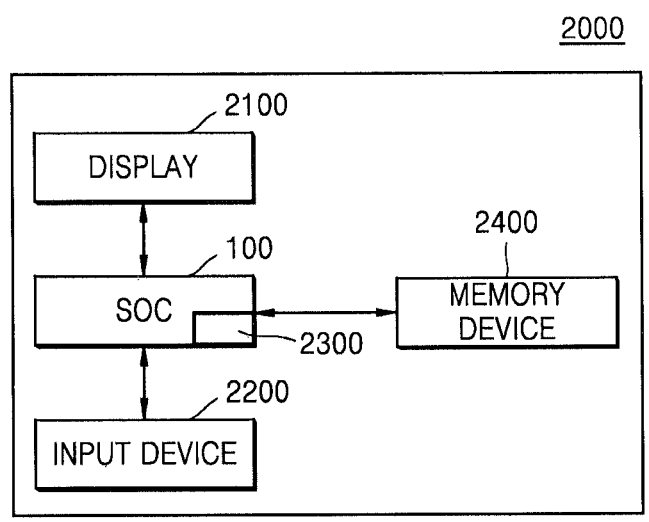
FIG. 14 is a block diagram of a computer system including the SOC illustrated in FIG. 1, according to an exemplary embodiment of the present inventive concepts.

FIG. 14 illustrates a computer system 2000 including the SOC 100 illustrated in FIG. 1, according to an exemplary embodiment of the present inventive concepts.

Referring to FIG. 14, the computer system 2000 including the SOC 100 illustrated in FIG. 1 may include a personal computer (PC), a network server, a tablet PC, a net-book, an e-reader, a personal digital assistant (PDA), a portable multimedia player (PMP), an MP3 player, or an MP4 player. The computer system 2000 includes the SOC 100, a memory device 2400, a memory controller 2300 which may control a data processing operation of the memory device 2400, a display 2100, and an input device 2200.

The SOC 100 may display data stored in the memory device 2400 according to data input by the input device 2200, via the display 2100. For example, the input device 2200 may include a pointing device, such as a touch pad or a computer mouse, a keypad, or a keyboard. The SOC 100 may control general operations of the computer system 2000 and may control an operation of the memory controller 2300. The memory controller 2300 which may control the operation of the memory device 2400 may be included in the SOC 100 as part of the SOC 100 or may be realized as an additional chip which is different from the SOC 100, according to an exemplary embodiment.

Figure 15:
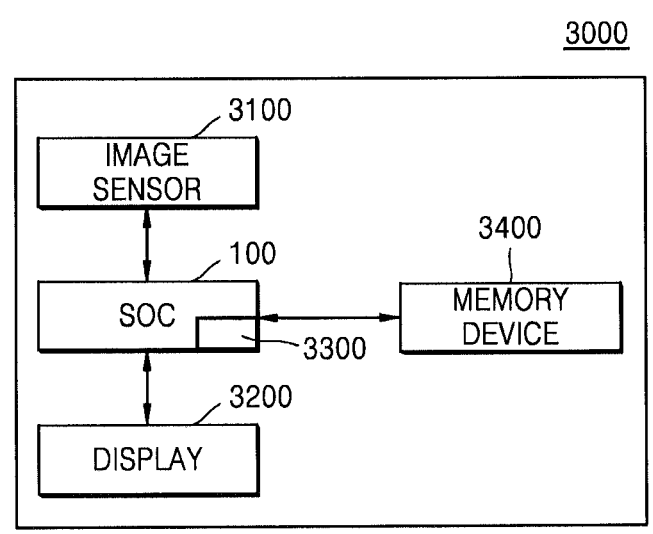
FIG. 15 is a block diagram of a computer system including the SOC illustrated in FIG. 1, according to another exemplary embodiment of the present inventive concepts.

FIG. 15 is a computer system 3000 including the SOC 100 illustrated in FIG. 1, according to another exemplary embodiment of the present inventive concepts.

Referring to FIG. 15, the computer system 3000 including the SOC 100 illustrated in FIG. 1 may include an image process device, for example, a digital camera, a mobile telephone including the digital camera, or a smart phone. The computer system 3000 includes the SOC 100, a memory device 3400, and a memory controller 3300 which may control a data processing operation of the memory device 3400, for example, a writing operation or a reading operation. Also, the computer system 3000 further includes an image sensor 3100 and a display 3200.

The image sensor 3100 of the computer system 3000 converts an optical image into digital signals and the converted digital signals are transmitted to the SOC 100 or the memory controller 3300. According to a control of the SOC 100, the converted digital signals may be displayed via the display 3200 or stored in the memory device 3400 via the memory controller 3300. Also, the data stored in the memory device 3400 is displayed via the display 3200 according to the control of the SOC 100 or of the memory controller 3300. According to an exemplary embodiment, the memory controller 3300 which may control the operation of the memory device 3400 may be included in the SOC 100 as part of the SOC 100 or may be formed as an additional chip separately from the SOC 100. Also, the SOC 100 according to the exemplary embodiments of the present inventive concepts may be packaged by any one method of through silicon via (TSV), system in package (SIP), and multi-chip package (MCP). The TSV is a recent technology of manufacturing a 3D chip, which stacks and attaches a plurality of SOCs 100 in a vertical direction by using the TSV, in order to enlarge densities of a semiconductor memory and a memory module.

The MCP is the package including a plurality of SOCs 100. The MCP may assemble necessary memories according to application products and greatly contribute in space efficiency of mobile communication devices, such as mobile telephones.

While the present inventive concepts have been particularly shown and described with reference to exemplary embodiments thereof, it will be understood that various changes in form and details may be made herein without departing from the spirit and scope of the following claims. For example, only the examples in which the memory device is a flash memory device are illustrated herein. However, the present inventive concepts is not limited thereto and may include various non-volatile memory devices in addition to the flash memory device.

What is claimed is:

1. A system on chip (SOC) comprising:
   at least one core comprising a plurality of scan chains operating by a trigger signal;
   a delay controller configured to generate a delay target selection signal selecting at least one of the plurality of scan chains and a delay depth control signal indicating a delay depth of the trigger signal; and
   a delay signal generating unit configured to delay the trigger signal based on the delay target selection signal and the delay depth control signal and to provide the delayed trigger signal to the plurality of scan chains, wherein the delay signal generating unit comprises a plurality of delay timing units configured to receive the delay target selection signal, the delay depth control signal and the trigger signal.

2. The SOC of claim 1, wherein the trigger signal is a set/reset signal.

3. The SOC of claim 1, wherein the delay controller comprises a delay target selecting unit configured to receive a delay information signal and generate the delay target selection signal.

4. The SOC of claim 3, wherein the delay target selecting unit comprises a plurality of flip-flops which are sequentially connected and are configured to receive the delay information signal and output the delay target selection signal.

5. The SOC of claim 1, wherein the delay controller comprises a delay depth control unit configured to receive the delay information signal and generate the delay depth control signal.

6. The SOC of claim 5, wherein the delay depth control unit comprises a plurality of flip-flops which are sequentially connected and are configured to receive the delay information signal and output the delay depth control signal.

7. The SOC of claim 1, wherein the plurality of delay timing units comprises at least one scan delay unit configured to generate a delayed trigger signal by delaying the trigger signal based on the delay target selection signal and the delay depth control signal.

8. The SOC of claim 7, wherein the at least one scan delay unit comprises at least one delay unit configured to determine toggling of the delayed trigger signal based on the delay target selection signal and select a delay time of the delayed trigger signal based on the delay depth control signal.

9. The SOC of claim 1, further comprising a joint test action group (JTAG) interface configured to set the delay target selection signal and the delay depth control signal before providing the delayed trigger signal to the plurality of scan chains.

10. A system-on-chip (SOC) comprising:
at least one core comprising a plurality of scan chains operating by a trigger signal;
a delay controller configured to generate a delay target selection signal selecting at least one of the plurality of scan chains and a delay depth control signal indicating a delay depth of the trigger signal;
a delay signal generating unit configured to delay the trigger signal based on the delay target selection signal and the delay depth control signal and to provide the delayed trigger signal to the plurality of scan chains, wherein the delay signal generating unit comprises a plurality of delay timing units configured to receive the delay target selection signal, the delay depth control signal and the trigger signal; and
a joint test action group (JTAG) interface configured to receive the delay target selection signal and the delay depth control signal.

11. The SOC of claim 10, wherein the trigger signal is a set/reset signal.

12. The SOC of claim 10, wherein the delay controller comprises a delay target selecting unit configured to receive a delay information signal and generate the delay target selection signal.

13. The SOC of claim 12, wherein the delay target selecting unit comprises a plurality of flip-flops which are sequentially connected and are configured to receive the delay information signal and output the delay target selection signal.

14. The SOC of claim 10, wherein the delay controller comprises a delay depth control unit configured to receive a delay information signal and generate the delay depth control signal.

15. The SOC of claim 14, wherein the delay depth control unit comprises a plurality of flip-flops which are sequentially connected and are configured to receive the delay information signal and output the delay depth control signal.

16. The SOC of claim 10, wherein the plurality of delay timing units comprises at least one scan delay unit configured to generate a delayed trigger signal of the trigger signal based on the delay target selection signal and the delay depth control signal.

17. The SOC of claim 16, wherein the scan delay unit comprises at least one delay unit configured to determine toggling of the delayed trigger signal based on the delay target selection signal and select a delay time of the delayed trigger signal based on the delay depth control signal.

18. The SOC of claim 10, wherein the delay target selection signal and the delay depth control signal are pre-set via the JTAG interface before the delayed trigger signal is provided to the plurality of scan chains.

* * * * *